(12) United States Patent
Lin et al.

(10) Patent No.: US 8,120,903 B2
(45) Date of Patent: Feb. 21, 2012

(54) STORAGE APPARATUS

(75) Inventors: Wei-Hung Lin, Jhubei (TW);
Chang-Chih Chen, Jhubei (TW);
Hung-Yi Chung, Jhudong Township,
Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 490 days.

(21) Appl. No.: 12/345,406

(22) Filed: Dec. 29, 2008

(65) Prior Publication Data
US 2010/0091469 A1 Apr. 15, 2010

(30) Foreign Application Priority Data

Oct. 13, 2008 (TW) ................................ 97139191 A

(51) Int. Cl.
*G06F 1/16* (2006.01)
*H05K 5/00* (2006.01)
*H05K 7/00* (2006.01)
*H01R 13/44* (2006.01)

(52) U.S. Cl. ..................................... 361/679.4; 439/135

(58) Field of Classification Search ............ 361/679.02, 361/679.31–679.33, 679.37–679.4; 439/135, 439/358

See application file for complete search history.

(56) References Cited

U.S. PATENT DOCUMENTS

| | | | |
|---|---|---|---|
| 6,778,401 B1 * | 8/2004 | Yu et al. ......................... | 361/752 |
| 7,035,110 B1 * | 4/2006 | Wang et al. ..................... | 361/737 |
| 7,095,617 B1 * | 8/2006 | Ni ................................... | 361/736 |
| 7,172,460 B2 * | 2/2007 | Zhao et al. ................ | 439/607.56 |
| D537,819 S * | 3/2007 | Zhao et al. ................. | D14/480.1 |
| 7,223,574 B2 * | 5/2007 | Lei et al. ......................... | 435/135 |
| 7,241,153 B2 * | 7/2007 | He et al. ......................... | 439/148 |
| 7,359,208 B2 | 4/2008 | Ni | |
| 7,422,454 B1 * | 9/2008 | Tang et al. ...................... | 439/131 |
| 7,440,286 B2 * | 10/2008 | Hiew et al. ...................... | 361/737 |
| 7,524,198 B2 * | 4/2009 | Nguyen et al. ................. | 439/131 |
| 7,535,719 B2 * | 5/2009 | Hiew et al. ...................... | 361/737 |
| 7,551,450 B2 * | 6/2009 | Sugawara et al. .............. | 361/752 |
| 7,581,967 B2 * | 9/2009 | Collantes et al. .............. | 439/131 |
| 7,709,946 B2 * | 5/2010 | Ryu et al. ....................... | 257/692 |
| 7,771,215 B1 * | 8/2010 | Ni et al. .......................... | 439/131 |
| 7,872,873 B2 * | 1/2011 | Hiew et al. ...................... | 361/737 |
| 2004/0145875 A1 * | 7/2004 | Yu et al. .......................... | 361/752 |
| 2004/0233645 A1 * | 11/2004 | Chen ............................... | 361/737 |
| 2006/0166555 A1 * | 7/2006 | Zhao et al. ...................... | 439/607 |
| 2006/0211279 A1 * | 9/2006 | He et al. ......................... | 439/76.1 |
| 2007/0015407 A1 * | 1/2007 | Loftus ............................ | 439/607 |
| 2007/0171620 A1 * | 7/2007 | Lee ................................. | 361/737 |
| 2007/0292009 A1 * | 12/2007 | Nguyen et al. ................. | 382/124 |
| 2008/0280490 A1 * | 11/2008 | Nguyen et al. ................. | 439/607 |

FOREIGN PATENT DOCUMENTS

TW M275511 9/2005

* cited by examiner

*Primary Examiner* — Jinhee Lee
*Assistant Examiner* — Adrian S Wilson
(74) *Attorney, Agent, or Firm* — J.C. Patents

(57) ABSTRACT

A storage apparatus including a circuit board, a first flash memory, a first golden finger, a control unit, and a supporting component is provided. The circuit board has a first surface and a second surface. The first flash memory is disposed on the circuit board. The first golden finger and the control unit are disposed on an end of the circuit board, in which the first golden finger is disposed on the first surface, and the control unit is disposed on the second surface, and the control unit is substantially on the backside of the first golden finger. The control unit is electrically connected with the first memory and the first golden finger. The supporting component is used for supporting the circuit board.

17 Claims, 5 Drawing Sheets

STORAGE APPARATUS

CROSS-REFERENCE TO RELATED APPLICATION

This application claims the priority benefit of Taiwan application serial no. 97139191, filed on Oct. 13, 2008. The entirety of the above-mentioned patent application is hereby incorporated by reference herein and made a part of specification.

BACKGROUND OF THE INVENTION

1. Field of the Invention

The present invention generally relates to a storage apparatus, in particular, to a storage apparatus that can be fitted with any housing and can easily be modularized.

2. Description of Related Art

With the development of computer technology, computers have become indispensable for most people's life, and thus how to transfer files between different computers has become one of the daily-life issues. Due to the development in application of multimedia, the resulting files are getting increasingly larger. Although a magnetic disk of 1.44 MB is convenient to carry, the capacity thereof does not meet the requirement of capacity demand. On the other hand, while the hard disks in computers have a large capacity, they are inconvenient for the user to carry with due to their large volumes. Recently, as the Universal Serial Bus (USB) interface gets popularized and the flash memory gets less expensive, a storage apparatus with a large capacity, a good compatibility, and a convenient portability has appeared, which is called a flash drive or a USB Flash Disk. Such a storage apparatus allows the user to carry out data transfer between different computers or storage apparatus conveniently.

FIG. 1 is a schematic structural view of a conventional storage apparatus 100. Referring to FIG. 1, the storage apparatus 100 includes a circuit board 110 and a set of housing 120. The circuit board 110 includes a docking portion 112, a control unit 114, and a flash memory 116. The docking portion 112 serves as a connection port for USB, the control unit 114 is used to control the flash memory 116 to carry out data read and write, and the flash memory 116 is used for data storage.

However, as the docking portion 112 of the storage apparatus 100 is directly fixed on the circuit board 110, and the circuit board 110 also has electronic components such as the control unit 114 and the flash memory 116, the circuit board 110 must have a certain area and length to support the electronic components. Since the circuit board 110 must have a certain area and length, the apparent volume of the storage module 100 is limited and cannot get further reduced.

Accordingly, another storage module having smaller apparent volume has appeared. FIG. 2 is a schematic structural view of another conventional storage apparatus 200. Referring to FIG. 2, the apparatus 200 includes a circuit board 210, a docking portion 220, and a housing 230. As for the circuit board 210, a System in Package (SIP) technology is employed to construct various types of electronic elements on the circuit board 210 into a systematic integrated package by the use of plastic, metal, or ceramics material, so as to protect the electronic elements in the package structure. The storage apparatus 200 can be easily modularized and manufactured in mass due to the employment of the systematic package.

However, as in the systematic package, all the electronic elements are packaged into a package structure, the package structure cannot get repaired and would be simply discarded when one of the elements therein fails. On the other hand, in the manufacture process for the package structure, once an error has occurred in the process, it is difficult to get reworked. Thus, the yield of the packaging process directly impacts the manufacturing cost of the storage module 200.

SUMMARY OF THE INVENTION

Accordingly, an embodiment of the present invention is directed to a storage apparatus, which includes a circuit board, a first flash memory, a first golden finger (connecting finger), a control unit, and a supporting component. The circuit board has a first surface and a second surface. The first flash memory is disposed on the circuit board. The first golden finger and the control unit are disposed on an end of the circuit board. The first golden finger is disposed on the first surface, the control unit is disposed on the second surface, and the control unit is substantially on the backside of the first golden finger. The control unit is electrically connected with the first flash memory and the first golden finger. The supporting component is used for supporting the circuit board.

In an embodiment of the present invention, the above circuit board has at least one first settling portion, and the supporting component has at least one second settling portion engaged with the first settling portion, so as to maintain the relative positions of the circuit board and the supporting component. The first settling portion has a recessed shape and is located on a side edge of the circuit board, and the second settling portion has a protruding shape.

In an embodiment of the present invention, the above supporting component has a receiving space and a slit. The receiving space is used to accommodate the control unit, and the slit is used for the circuit board with the control unit to pass through.

In an embodiment of the present invention, the above first flash memory is disposed on one of the first or second surface.

In an embodiment of the present invention, the above storage apparatus further includes a second flash memory. The second flash memory and the first flash memory are respectively disposed on the first surface and the second surface.

In an embodiment of the present invention, the above storage apparatus further includes an iron case which is sleeved on at least part of the supporting component and at least part of the circuit board. The iron case has a hook, and the supporting component has a slot for fastening the hook, so as to fix the iron case on the supporting component.

In an embodiment of the present invention, the above storage apparatus further includes an upper housing and a lower housing for covering at least part of the iron case, at least part of the supporting component, and at least part of the circuit board.

In an embodiment of the present invention, the above lower housing has a fixing unit for fixing the circuit board.

In an embodiment of the present invention, the above storage apparatus further includes a second golden finger electrically connected with the first golden finger. The second golden finger and the supporting component are integrally formed.

In an embodiment of the present invention, the above second golden finger has an elastic structure extending therefrom, and the elastic structure is electrically connected with the first golden finger.

In an embodiment of the present invention, the above storage apparatus further includes an upper cover. The upper cover is combined with the supporting component and covers the circuit board.

In an embodiment of the present invention, the above storage apparatus further includes an iron case sleeved on at least part of the upper cover and at least part of the supporting component.

In an embodiment of the present invention, the above storage apparatus further includes an upper housing and a lower housing, for covering at least part of the upper cover, at least part of the supporting component, and at least part of the iron case.

In an embodiment of the present invention, the above upper cover and supporting component are of a plastic material.

In an embodiment of the present invention, the above upper and lower housings are of a plastic material or a metal material.

In an embodiment of the present invention, the material for the above elastic structure is phosphor bronze.

According to an embodiment of the present invention, the golden finger and the control unit of the storage apparatus are respectively located on two opposite surfaces of the circuit board, so that the length of the circuit board is shortened, the volume of the storage apparatus is further reduced, and the storage apparatus is easily modularized. As such, the storage apparatus is applicable with various housings, so that the storage apparatus is diversified in appearance, and considerably convenient and practical in manufacturing and usage.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
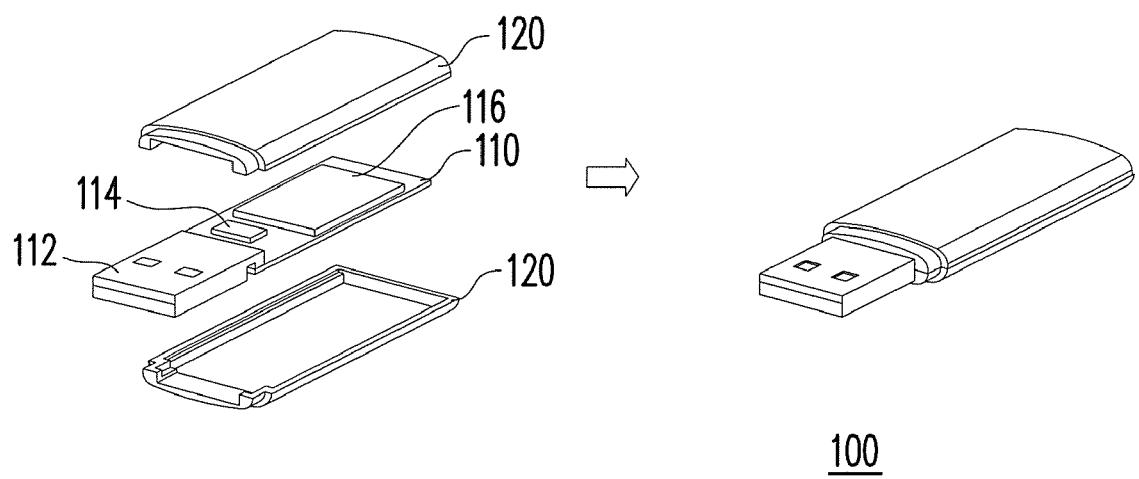
FIG. 1 is a schematic structural diagram of a conventional storage apparatus 100.
Figure 2:
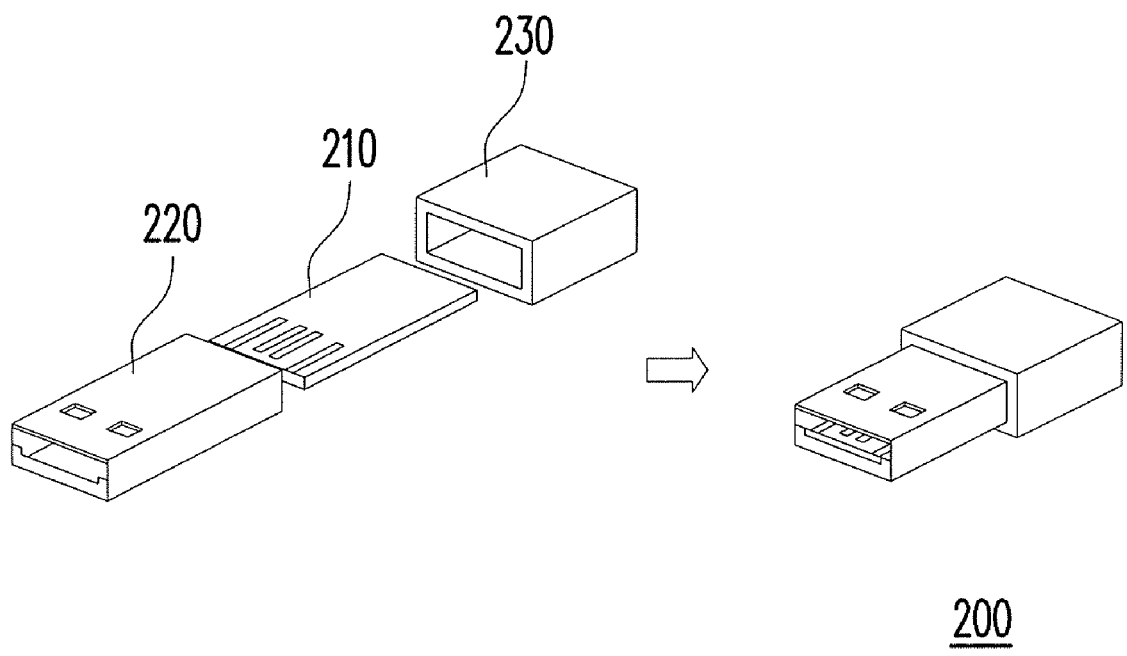
FIG. 2 is a schematic structural diagram of another conventional storage apparatus 200.

Reference will now be made in detail to the present preferred embodiments of the invention, examples of which are illustrated in the accompanying drawings. Wherever possible, the same reference numbers are used in the drawings and the description to refer to the same or like parts.

Figure 3:
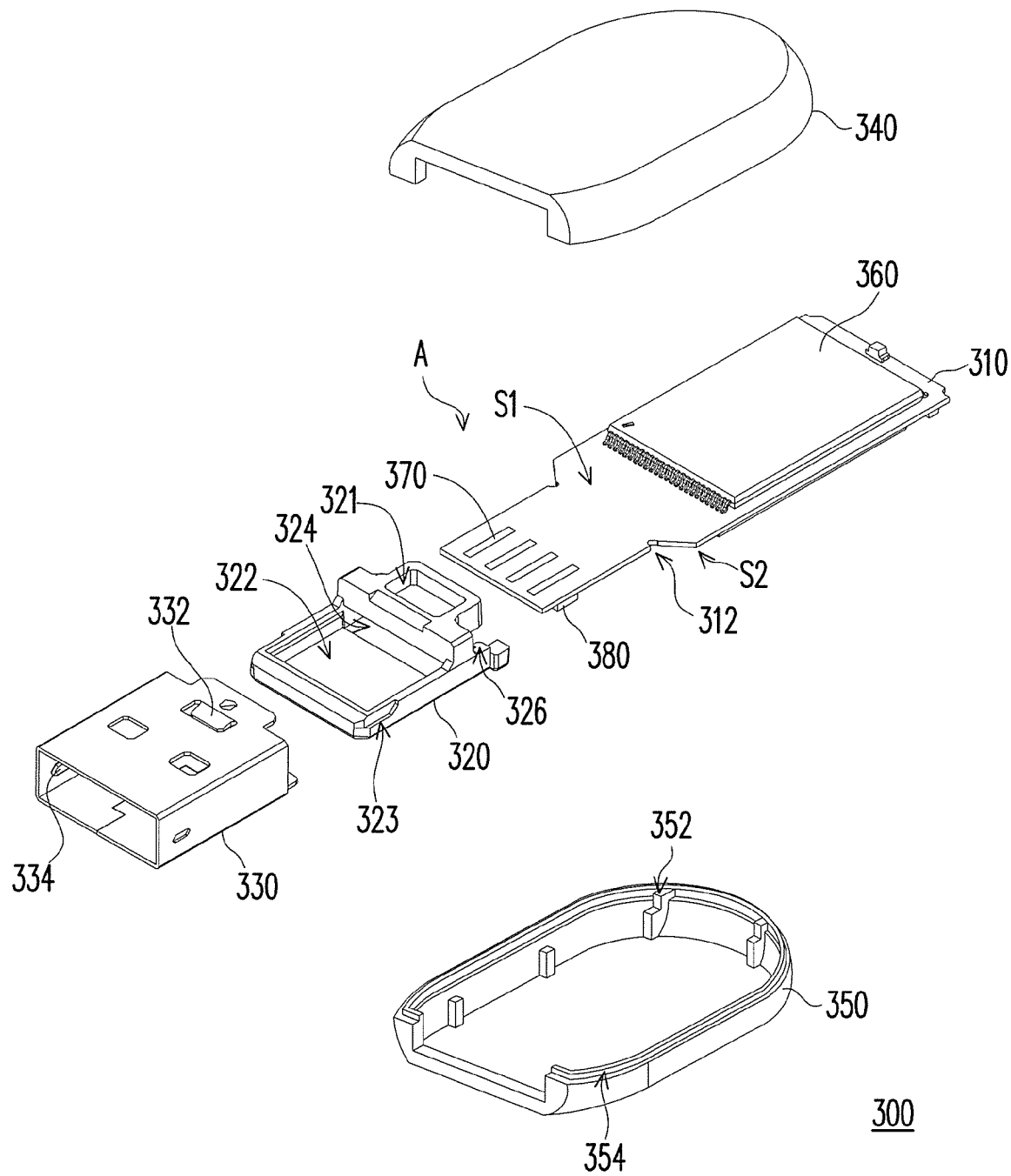
FIG. 3 is an explosive diagram of a storage apparatus 300 according to an embodiment of the present invention.

FIG. 3 is an explosive diagram of a storage apparatus 300 according to an embodiment of the present invention. Referring to FIG. 3, the storage apparatus 300 includes a circuit board 310, a supporting component 320, a first flash memory 360, a first golden finger 370, and a control unit 380. The supporting component 320 is used for supporting the circuit board 310. The circuit board 310 has a first surface S1 and a second surface S2. The first flash memory 360 is disposed on the circuit board 310. The first golden finger 370 and the control unit 380 are disposed on an end A of the circuit board 310. The first golden finger 370 is disposed on the first surface S1, the control unit 380 is disposed on the second surface S2, and the control unit 380 is substantially on the backside of the first golden finger 370. As used herein, the word "substantially" means that the control unit 380 at least partially overlaps the first golden finger 370. In this embodiment, the control unit 380 may be attached to the second surface S2 by using the Surface Mount Technology (SMT). In addition, the first flash memory 360 may also be attached to the first surface S1 or the second surface S2 by using the SMT.

Moreover, it should be noted that, the control unit 380, the first golden finger 370, and the first flash memory 360 are electrically connected with each other. The control unit 380 is used to control access to the first flash memory 360, and the first flash memory 360 is used for data storage.

In this embodiment, the length of the circuit board 310 is saved as the first golden finger 370 and the control unit 380 are located on two opposite surfaces S1 and S2 of the same end A of the circuit board 310. Therefore, compared with conventional storage apparatus, the storage apparatus 300 according to an embodiment of the present invention has a smaller apparent volume and a lower manufacturing cost, and can satisfy the demand for light, thin, short, and small electronic products in the market.

More particularly, the supporting component 320 has a receiving space 322 and a slit 324. The slit 324 is used for the circuit board 310 with the control unit 380 to pass through, and the receiving space 322 is used for accommodating the control unit 380 therein after the circuit board 310 with the control unit 380 passed through the slit 324. In this way, a space is provided so that the first golden finger 370 and the control unit 380 are located on the same end A of the circuit board 310, and the length of the circuit board 310 is further shortened, thus further reducing in the volume of the storage apparatus 300.

Also, in order to enable the supporting component 320 to support the circuit board 310 stably, in this embodiment, the circuit board 310 has a first settling portion 312 having, for example, a recessed shape. The supporting component 320 has a second settling portion 326 having, for example, a protruding shape, and the second settling portion 326 is engaged with the first settling portion 312. With the first settling portion 312 and the second settling portion 326 being engaged with each other, the circuit board 310 can be stably supported on the supporting component 320. The present invention does not limit the number and location of the first settling portion 312 and the second settling portion 326, and the designer may dispose the first settling portion 312 and the second settling portion 326 respectively on other positions of the circuit board 310 and the supporting component 320 appropriately as desired according to the requirements and the supporting conditions. In this embodiment, the supporting component 320 and has two second settling portions 312, and the circuit board 310 has two first settling portions 326, wherein the second settling portions 312 are engaged with the first settling portions; while in another embodiment of the present invention, which is not shown in figures of the present invention, the circuit board 310 and the supporting component 320 may respectively have one first settling portion 312 and one second settling portion 326.

In this embodiment, the storage apparatus 300 further includes an iron case 330 which is sleeved on at least part of the supporting component 320 and at least part of the circuit board 310. The iron case 330 has a hook 332, and the supporting component 320 has a slot 321 for fastening the hook 332. With the combination of the hook 332 and the slot 321, the iron case 330 is fixed on the supporting component 320. Also, the iron case 330 has a first stopper 334 located on the inner wall of the iron case 330, and the supporting component 320 has a second stopper 323 corresponding to the first stopper 334. When the iron case 330 is sleeved on the supporting component 320, the supporting component 320 is settled in the iron case 330 due to the cooperation of the first stopper 334 and the second stopper 323.

In the embodiment of the present invention, in addition to protecting the first golden finger 370 therein, the iron case 330 also functions as an interface connector for connecting the USB, so that data transmission and transfer may be carried out between the storage apparatus 300 and the computer or other storage apparatus connected therewith.

In this embodiment, the storage apparatus 300 further includes an upper housing 340 and a lower housing 350, for covering at least part of the iron case 330, at least part of the supporting component 320, and at least part of the circuit board 310. Additionally, the lower housing 350 has at least one fixing unit 352, such as a supporting portion, for fixing the circuit board 310 on the lower housing 350. Also, one of the upper housing 340 and the lower housing 350 has a first protrusion 354 extending from the edge of the housing, and the other one of the upper housing 340 and the lower housing 350 has a recession (not shown in FIG. 3) corresponding to the first protrusion 354, so that the upper housing 340 and the lower housing 350 are combined smoothly. In the embodiment of the present invention, the upper housing 340 and the lower housing 350 are of a material such as plastic or metal, and are used for protection and convenient for the user to hold. Therefore, the storage apparatus 300 is, but not limited to, applicable to an upper housing 340 and lower housing 350 with the above functions and unrestricted shapes.

It should be noted that, in this embodiment, the first flash memory 360 is disposed on the first surface S1 of the circuit board 310, but the position of the first flash memory 360 is not limited in the present invention. In another embodiment of the present invention, which is not shown in figures of the present invention, the first flash memory 360 may also be disposed on the second surface S2 of the circuit board 310. Also, in another embodiment of the present invention, the storage apparatus 300 further includes a second flash memory (not shown in figures of the present invention). The second flash memory and the first flash memory 360 may be respectively disposed on the surface S1 and the second surface S2 of the circuit board 310.

Figure 4:
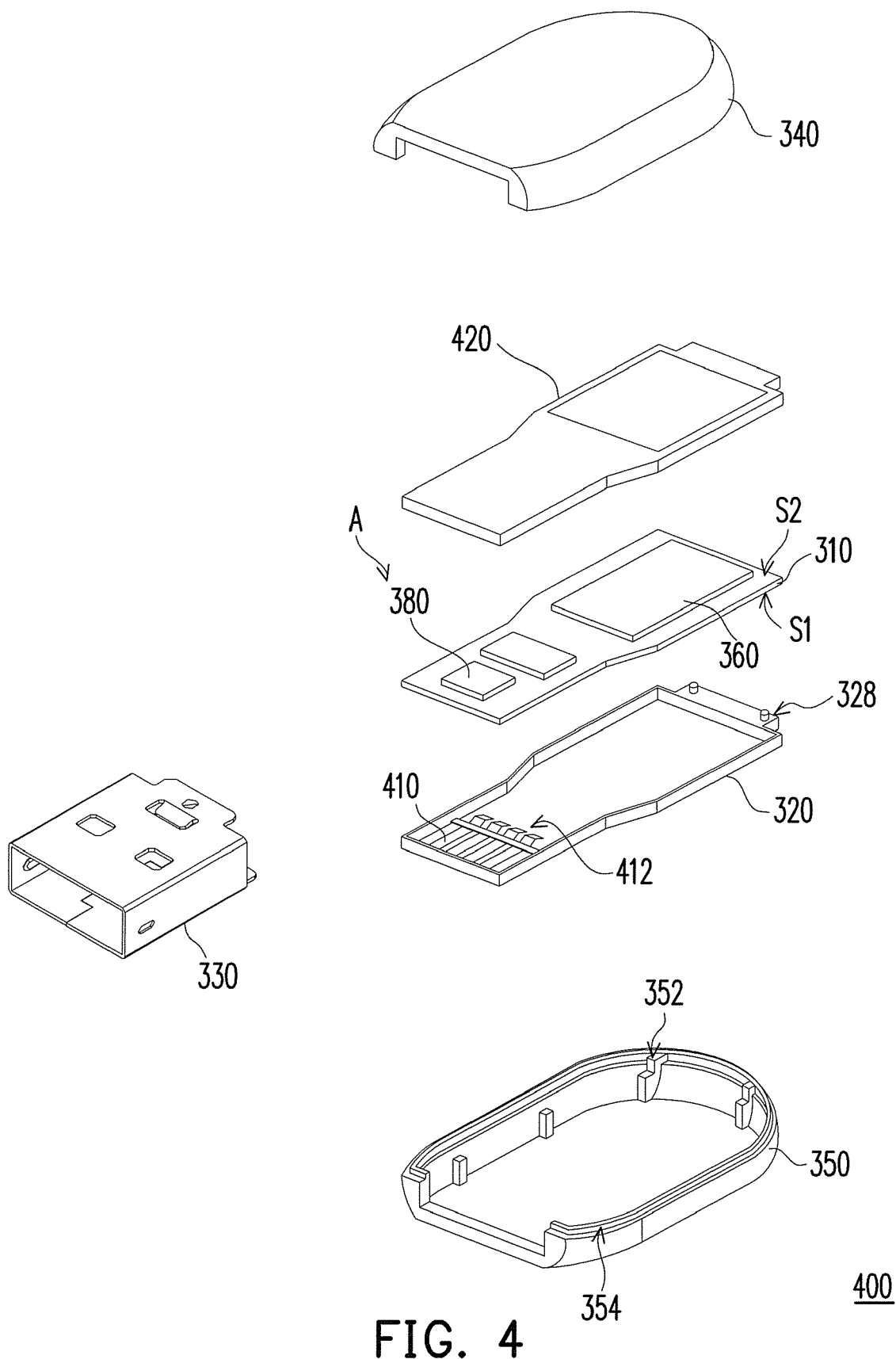
FIG. 4 is an explosive diagram of another storage apparatus 400 according to an embodiment of the present invention.
Figure 5:
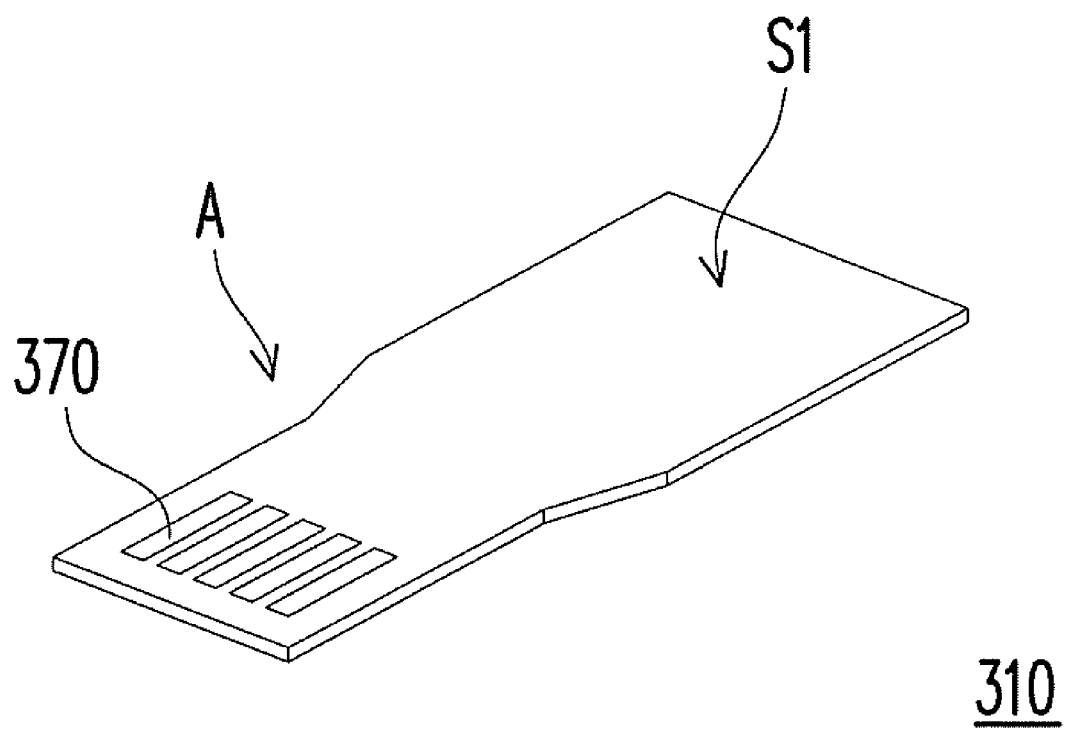
FIG. 5 is a schematic diagram of the first surface S1 of the circuit board 310 in FIG. 4.

In an embodiment of the present invention, another storage apparatus is further provided. FIG. 4 is an explosive diagram of another storage apparatus 400 according to an embodiment of the present invention. FIG. 5 is a schematic diagram of a first surface S1 of the circuit board 310 in FIG. 4. With reference to both FIGS. 4 and 5, different from the above embodiments, the storage apparatus 400 further includes a second golden finger 410 which is electrically connected with the first golden finger 370, so that the control unit 380 is electrically connected with the second golden finger 410 via the first golden finger 370. In this embodiment, the second golden finger 410 and the supporting component 320 are manufactured to be integrally formed by the use of plastic injection technology.

In an embodiment of the present invention, the first flash memory 360 may be disposed on the second surface S2 of the circuit board 310. In this way, with the first flash memory 360 and the control unit 380 being located on the same surface, the thickness of the combined upper cover 420 and supporting component 320 is effectively decreased, thus further reducing the volume of the storage apparatus 400.

On the other hand, the second golden finger 410 has an elastic structure 412 extending there-from, which is made of a material such as phosphor bronze, The elastic structure 412 is connected to the first golden finger 370, so that the first golden finger 370 and the second golden finger 410 are electrically connected with each other. In this embodiment, the elastic structure 412 touches against the first golden finger 370 by way of its elasticity. Alternatively, the elastic structure 412 may be connected with the first golden finger 370 by the way of welding. In another embodiment of the present invention, which is not shown in figures of the present invention, the material of the elastic structure 412 may also be beryllium copper or other materials having conductivity and good elasticity. The present invention is not limited in this respect.

Also, the storage apparatus provided by the embodiment of the present invention further includes an upper cover 420 which is combined with the supporting component 320 to cover the circuit board 310 therein. In this embodiment, the upper cover 420 and the supporting component 320 may be made of a material such as plastic, and may be manufactured with injection molding technology. The second golden finger 410 may also be placed in together in the molding process, so as to save the subsequent assembling steps.

Besides, the supporting component 320 also has a plurality of second protrusions 328 and the upper cover 420 has a plurality of recessions (not shown in FIG. 4). The second protrusions 328 are mortised in the recessions of the upper cover 420, so that the upper cover 420 and the supporting component 320 are combined to cover the circuit board 310 therein. In this way, the circuit board 310, the control unit 380, and the first flash memory 360 are protected in the upper cover 420 and the supporting component 320, and besides, when the electronic elements fail, the upper cover 420 and the supporting component 320 may be removed for repair. Compared with the conventional storage apparatus in which the circuit board is completely packaged and incapable of repair, the storage apparatus 400 provided by the embodiment of the present invention has a better utility and a lower manufacturing cost as being repairable.

Also, in an embodiment of the present invention, after the upper cover 420 and the supporting component 320 are combined, the iron case 330 may be sleeved on at least part of the upper cover 420 and at least part of the supporting component 320. The iron case 330 has a groove (not shown in FIG. 4) on the inner wall of the iron case 330, and thus the combined upper cover 420 and the supporting component 320 enter the iron case 330 along the groove and then hold in the iron case 330. Then, the upper housing 340 and the lower housing 350 cover at least part of the iron case 330, at least part of the upper cover 420, and at least part of the supporting component 320, so that the storage apparatus 400 provided by the embodiment of the present invention is assembled.

In view of the above, in an embodiment of the present invention, the golden finger and the control unit of the storage apparatus are located on two opposite surfaces of the circuit board, thus the length of the circuit board is shortened and the volume of the storage apparatus is reduced. Besides, the supporting component has a slit for the circuit board with the control unit to pass through and a receiving space for accommodating the control unit, so that the inner space of the storage apparatus is effectively utilized. Further, the upper and lower housings and the supporting component of the storage apparatus are all detachable from the circuit board, thus the flexibility in assembling the storage apparatus is increased, so that the storage apparatus is applicable to housings of various shapes, thereby increasing the diversity in the shape of the storage apparatus.

Also, in another embodiment of the present invention, the control unit and the flash memory of the storage apparatus are disposed on the same plane so as to decrease the thickness of the package and thus reduce the volume of the storage apparatus. In addition, the upper cover and the supporting component may have the circuit board packaged therein, so when the electronic elements in the circuit board fail, the upper cover and the supporting component may be immediately disassembled to carry out reparation. Therefore, the storage apparatus is practical and convenient in terms of usage and repair.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A storage apparatus, comprising:
   a circuit board, comprising a first surface and a second surface;
   a first golden finger, disposed on the first surface and located on an end of the circuit board;
   a control unit, electrically connected with the first golden finger, disposed on the second surface and located on the end of the circuit board, wherein the control unit is substantially on a backside of the first golden finger;
   at least one flash memory, disposed on the circuit board and electrically connected with the control unit;
   a supporting component, for supporting the circuit board; and
   a second golden finger, electrically connected with the first golden finger, wherein the second golden finger and the supporting component are integrally formed.

2. The storage apparatus according to claim 1, wherein the circuit board has at least one first settling portion and the supporting component has at least one second settling portion engaged with the first settling portion, so as to maintain relative positions of the circuit board and the supporting component.

3. The storage apparatus according to claim 2, wherein the first settling portion is of a recessed shape and is located on a side edge of the circuit board, the second settling portion is of a protruding shape, and the first settling portion and the second settling portion are engaged with each other.

4. The storage apparatus according to claim 1, wherein the supporting component has a receiving space for accommodating the control unit.

5. The storage apparatus according to claim 1, wherein the supporting component has a slit for the circuit board with the control unit to pass through.

6. The storage apparatus according to claim 1, wherein the flash memory is disposed on the first surface or the second surface.

7. The storage apparatus according to claim 1, further comprising an iron case, sleeved on the at least part of the supporting component and the at least part of the circuit board.

8. The storage apparatus according to claim 7, wherein the iron case has a hook and the supporting component further has a slot for fastening the hook, so that the iron case is fixed on the supporting component.

9. The storage apparatus according to claim 7, further comprising an upper housing and a lower housing, for covering the at least part of the iron case, the at least part of the supporting component, and the at least part of the circuit board.

10. The storage apparatus according to claim 9, wherein the lower housing has at least one fixing unit for fixing the circuit board.

11. The storage apparatus according to claim 9, wherein the upper housing, the lower housing, and the supporting component are of a plastic material.

12. The storage apparatus according to claim 1, wherein the second golden finger has an extended elastic structure which is electrically connected with the first golden finger.

13. The storage apparatus according to claim 1, further comprising:
    a upper cover, combined with the supporting component, for covering the circuit board.

14. The storage apparatus according to claim 13, further comprising an iron case, sleeved on at least part of the upper cover and at least part of the supporting component.

15. The storage apparatus according to claim 14, further comprising an upper housing and a lower housing, for at least partially covering the upper cover, the supporting component, and the iron case.

16. The storage apparatus according to claim 15, wherein the upper housing and the lower housing are of a plastic material or a metal material.

17. The storage apparatus according to claim 12, wherein a material of the elastic structure is phosphor bronze.

* * * * *